United States Patent [19]
Hirota

[11] Patent Number: 5,464,791
[45] Date of Patent: Nov. 7, 1995

[54] METHOD OF FABRICATING A MICRO-TRENCH STORAGE CAPACITOR

[75] Inventor: Toshiyuki Hirota, Tokyo, Japan

[73] Assignee: NEC Corporation, Tokyo, Japan

[21] Appl. No.: 297,964

[22] Filed: Aug. 30, 1994

[30] Foreign Application Priority Data

Aug. 31, 1993 [JP] Japan .................. 5-237271

[51] Int. Cl.$^6$ .............................................. H01L 21/8242
[52] U.S. Cl. ............................ 437/60; 437/52; 437/233; 437/919; 437/977
[58] Field of Search ............................ 437/47, 48, 52, 437/60, 233, 919, 977; 251/306, 309

[56]  References Cited

U.S. PATENT DOCUMENTS

| 5,134,086 | 7/1992 | Ahn | 437/60 |
| 5,204,280 | 4/1993 | Dhong et al. | 437/919 |
| 5,254,503 | 10/1993 | Kenney | 437/919 |
| 5,266,514 | 11/1993 | Tuan et al. | 437/919 |
| 5,302,540 | 4/1994 | Ko et al. | 437/60 |
| 5,350,707 | 9/1994 | Ko et al. | 437/60 |
| 5,372,962 | 12/1994 | Hirota | 437/60 |

OTHER PUBLICATIONS

"Characteristics of the NO Dielectric Film in the MTS (Micro–Trench Storage) Capacitor Structure" by S. T. Kim et al., Gyungki–Do, Korea, pp. 126–131.

Primary Examiner—Tom Thomas
Attorney, Agent, or Firm—Young & Thompson

[57]  ABSTRACT

A method of forming a stacked capacitor with a plurality of trench grooves. A silicon oxide film is deposited on a film having an electrical conductivity. A polysilicon film doped with an impurity is formed on the silicon oxide film. The polysilicon film is subjected to an etchant for causing a segregation of the impurity into crystal grains and subsequent selective removal of the polysilicon film to leave only the crystal grains on the silicon oxide film. The silicon oxide film is subjected to an anisotropic dry etching by use of the crystal grains as a first mask so as to leave only part of the silicon oxide film covered by the crystal grains. The electrically conductive film is subjected to an anisotropic dry etching by use of the remaining silicon oxide film as a second mask for a selective removal of the electrically conductive film to form a bottom electrode with a plurality of trenches. A dielectric film is formed on an entire surface of the bottom electrode, followed by a formation of a top electrode on the dielectric film.

42 Claims, 13 Drawing Sheets

METHOD OF FABRICATING A MICRO-TRENCH STORAGE CAPACITOR

BACKGROUND OF THE INVENTION

1. Field of the Invention

The invention relates to a method of fabricating a semiconductor device, and more particularly to a method of fabricating a micro-trench storage capacitor.

2. Description of the Related Art

Recently, requirement for improvement in a high density integration of large scale integrated circuits has been on the increase thereby a minimization in size of each element constituting the large scale integrated circuits is also required. The large scale integrated circuits generally include dynamic random access memories involving many capacitors. To obtain a further improvement in a high density integration of the large scale integrated circuit, a further minimization in size of the storage capacitors constituting memory devices is required.

On the other hand, the storage capacitor is of course required to have a necessary capacity. As well known, the capacity of the capacitor depends upon a contact area between electrode and dielectric film constituting the capacitor. A large contact area between the electrode and the dielectric film provides the capacitor with a large capacity.

To realize a further improvement in a high density in integration of the large scale integrated circuits involving the storage capacitors, each of the storage capacitors is required to have a possible small occupied area and a possible large contact surface between electrode and dielectric film involved in the capacitor. For that purpose, various capacitor structures have been proposed.

One of conventional structures of the capacitors is disclosed in the Japanese patent application No. 2-327069 in which a hemispheric grain polysilicon is used as a bottom electrode to allow the capacitor to have a large storage capacitor in a limited small occupied area.

Another of the conventional structures of the capacitors is disclosed in the Japanese laid-open patent application No. 3-139882 in which a polysilicon film with a high impurity concentration of phosphorus is formed on a high melting point siliside to be etched by a hot phosphorus etchant to form unevenness on a surface of the polysilicon film to enlarge a surface area thereof.

Still another of the conventional structures of the capacitors is disclosed in 1992 December, Proceeding of the 43rd Symposium on Semiconductors and Integrated Circuits Technology, pp. 126–131 in which a micro-trench storage capacitor was proposed. Fabrication processes of this conventional capacitor will be described in detail with reference to FIGS. 1A to 1C.

With reference to FIG. 1A, an isolation silicon oxide film 102 is formed on a surface of a silicon substrate 101. A silicon nitride film 103 is deposited on a surface of the isolation oxide film 102 by use of a chemical vapor deposition method. A silicon oxide film 104 is further deposited on a surface of the silicon nitride film 103 by use of a chemical vapor deposition method. A contact hole is formed by use of both lithography and etching to penetrate through the triplet films or the silicon oxide and silicon nitride films 102, 103 and 104 until a part of the surface of the silicon substrate 101 is exposed through the contact hole. A chemical vapor deposition is subsequently carried out to deposit a polysilicon film 106 having a thickness of 400 nanometers on a top surface of the silicon oxide film 104 to thereby fill the contact hole with the polysilicon. The polysilicon film is subjected to an introduction of phosphorus by use of diffusion. A silicon oxide film 107 having a thickness of 20 nanometers is deposited on a top surface of the phosphorus-doped polysilicon film 106 by use of a chemical vapor deposition. The polysilicon film 106 and the silicon oxide film 107 are then defined by lithography and etching processes thereby the remaining part of the polysilicon film serves as a bottom electrode. Hemispherical grains 108 of silicon are formed by use of a chemical vapor deposition method and subsequent annealing process, if any, on a top surface of the silicon oxide film 107, exposed side walls of the polysilicon film 106 and the top surface of the silicon oxide film 107.

With reference to FIG. 1B, the silicon oxide film 107 is subjected to a dry etching using the hemispherical grains 108 as masks so that the silicon oxide film 107 partially remains only under the hemispherical grains 108.

With reference to FIG. 1C, the polysilicon film 106 serving as the bottom electrode is subjected to a dry etching using the remaining silicon oxide film 107 as a mask to form trench grooves 106a under apertures of the remaining silicon oxide film 107 so that the bottom electrode has alternate trench grooves 106a and trench pillars.

With reference to FIG. 1D, the silicon oxide films 107 and 104 are etched by use of a fluorate etchant. A dielectric film 109 is formed on an entire surface of the bottom electrode with the trench grooves and the trench pillars. A polysilicon film 110 is deposited on the dielectric film 109 of an introduction of phosphorus and subsequent lithography and etching processes to define a top electrode of the polysilicon film 110. This results in a completion of the formation of the micro-trench storage capacitor.

The micro-trench structure comprising the alternate trench pillars and trench grooves enlarges the contact surface between the dielectric film and either of the top and bottom electrodes. Namely, the micro-trench structure comprising the alternate trench pillars and trench grooves allows the storage capacitor to have a sufficiently large capacity and a small occupied area for implementation of a high integration of the storage capacitors.

The above conventional fabrication methods for the microtrench storage capacitors is, however, engaged with problems as the hemispherical grains were used as mask to form the microtrench grooves. It is difficult to control the grain size which defines the size of the micro-trench pillars and apertures. To grow the grain, a clean silicon surface is also required, although it is difficult to keep the required clean surface of the silicon. It is further required to keep a clean atmosphere in a chamber involved in the heat treatment system, although it is difficult to keep the required clean atmosphere. Those constraints result in a lowering of an efficiency in manufacturing of the storage capacitors.

It is therefore required to develop a novel fabrication method for the required storage capacitor without use of any growth of crystal grain or application of the material for the mask on the substrate.

OBJECTS AND SUMMARY OF THE INVENTION

Accordingly, it is a primary object of the present invention to provide a novel method for fabricating a storage capacitor having a large capacity and a small occupied area.

It is a further object of the present invention to provide a novel method for fabricating a storage capacitor, which is free from any problems as described above.

It is a further more object of the present invention to provide a novel method of fabricating a storage capacitor with micro-trench pillars and grooves in opposite electrodes.

It is a still further object of the present invention to provide a novel method of forming a micro trench groove structure in a polysilicon film.

It is yet a further object of the present invention to provide a novel method of forming a micro trench groove structure in a metal film.

It is another object of the present invention to provide a novel method of fabricating a memory cell device including a transistor and a micro trench storage capacitor.

The above and other objects, features and advantages of the present invention will be apparent from the following descriptions.

The invention provides a novel method of forming a plurality of trench grooves in a film having an electrical conductivity comprising the steps of forming a film having an electrical conductivity, depositing a silicon oxide film on the electrically conductive film, forming a polysilicon film doped with an impurity on the silicon oxide film, subjecting the polysilicon film to an etchant for causing a segregation of the impurity into crystal grains and subsequent selective removal of the polysilicon film to leave only the crystal grains on the silicon oxide film, subjecting the silicon oxide film to an anisotropic dry etching by use of the crystal grains as a first mask so as to leave only part of the silicon oxide film covered by the crystal grains, and subjecting the electrically conductive film to an anisotropic dry etching by use of the remaining silicon oxide film as a second mask for a selective removal of the electrically conductive film to form a plurality of trench grooves in the electrically conductive film.

The invention also provides a method of forming a plurality of trench grooves in a film having an electrical conductivity comprising the steps of forming a film having an electrical conductivity, depositing a silicon oxide film on the electrically conductive film, forming an amorphous silicon film doped with an impurity on the silicon oxide film, subjecting the amorphous silicon film to an annealing for a crystallization of the amorphous silicon film into a polysilicon film, subjecting the polysilicon film including crystal grains to an etchant for a segregation of the impurity into crystal grains and subsequent selective removal of the polysilicon film to leave only the crystal grains on the silicon oxide film, subjecting the silicon oxide film to an anisotropic dry etching by use of the crystal grains as a first mask so as to leave only part of the silicon oxide film covered by the crystal grains, and subjecting the electrically conductive film to an anisotropic dry etching by use of the remaining silicon oxide film as a second mask for a selective removal of the electrically conductive film to form a plurality of trench grooves in the electrically conductive film.

The invention also provides a method of forming a stacked capacitor with a plurality of trench grooves comprising the steps of forming a film having an electrical conductivity, depositing a silicon oxide film on the electrically conductive film, forming a polysilicon film doped with an impurity on the silicon oxide film, subjecting the polysilicon film to an etchant for causing a segregation of the impurity into crystal grains and subsequent selective removal of the polysilicon film to leave only the crystal grains on the silicon oxide film, subjecting the silicon oxide film to an anisotropic dry etching by use of the crystal grains as a first mask so as to leave only part of the silicon oxide film covered by the crystal grains, subjecting the electrically conductive film to an anisotropic dry etching by use of the remaining silicon oxide film as a second mask for a selective removal of the electrically conductive film to form a bottom electrode with a plurality of trench grooves, forming a dielectric film on an entire surface of the bottom electrode, and forming a top electrode on the dielectric film.

The invention also provides a method of forming a stacked capacitor with a plurality of trench grooves comprising the steps of forming a film having an electrical conductivity, depositing a silicon oxide film on the electrically conductive film, forming an amorphous silicon film doped with an impurity on the silicon oxide film, subjecting the amorphous silicon film to an annealing for a crystallization of the amorphous silicon film into a polysilicon film, subjecting the polysilicon film including crystal grains to an etchant for a segregation of the impurity into crystal grains and subsequent selective removal of the polysilicon film to leave only the crystal grains on the silicon oxide film, subjecting the silicon oxide film to an anisotropic dry etching by use of the crystal grains as a first mask so as to leave only part of the silicon oxide film covered by the crystal grains, subjecting the electrically conductive film to an anisotropic dry etching by use of the remaining silicon oxide film as a second mask for a selective removal of the electrically conductive film to form a bottom electrode with a plurality of trench grooves, forming a dielectric film on an entire surface of the bottom electrode, and forming a top electrode on the dielectric film.

The invention also provides a method of fabricating a memory cell device with a transistor and a micro trench storage capacitor comprising the steps of selectively forming a field oxide film on a surface of a semiconductor substrate, selectively forming a gate oxide film on an exposed surface area of the semiconductor substrate, selectively forming a gate electrode on a part of the gate oxide film, selectively forming source and drain regions in the semiconductor substrate by use of an ion-implantation of an impurity using the gate electrode as a mask, forming a first inter-layer insulator on an entire surface of the device, forming a first contact hole in the first inter-layer insulator over the source region to form a field effect transistor, forming a film having an electrical conductivity on the first inter-layer insulator and within the first contact hole, depositing a silicon oxide film on the electrically conductive film, forming a polysilicon film doped with an impurity on the silicon oxide film, subjecting the polysilicon film to an etchant for causing a segregation of the impurity into crystal grains and subsequent selective removal of the polysilicon film to leave only the crystal grains on the silicon oxide film, subjecting the silicon oxide film to an anisotropic dry etching by use of the crystal grains as a first mask so as to leave only part of the silicon oxide film covered by the crystal grains, subjecting the electrically conductive film to an anisotropic dry etching by use of the remaining silicon oxide film as a second mask for a selective removal of the electrically conductive film to form a bottom electrode with a plurality of trench grooves, forming a dielectric film on an entire surface of the bottom electrode, and forming a top electrode on the dielectric film.

BRIEF DESCRIPTION OF THE DRAWINGS

Preferred embodiments of the present invention will hereinafter fully be described in detail with reference to the accompanying drawings.

DESCRIPTION OF THE PREFERRED EMBODIMENTS

A first embodiment according to the present invention will be described in detail with reference to FIGS. 2A to 2D in which a micro-trench storage capacitor is fabricated by a novel fabrication method.

Figure 1:
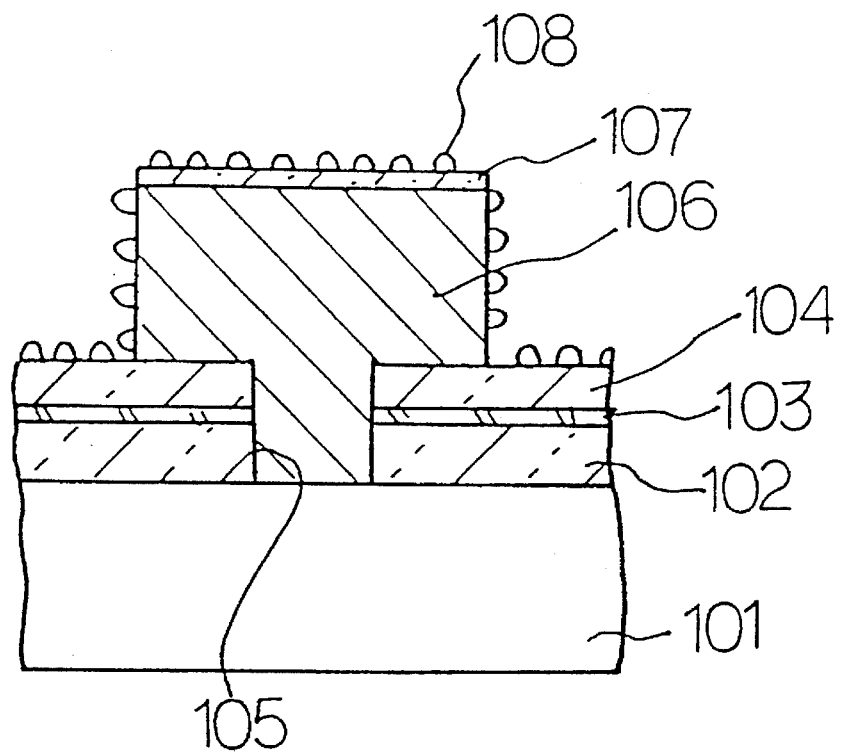
FIGS. 1A to 1D are cross sectional elevation views illustrative of a micro-trench storage capacitor in sequential fabrication steps involved in the conventional fabrication method.
Figure 1:
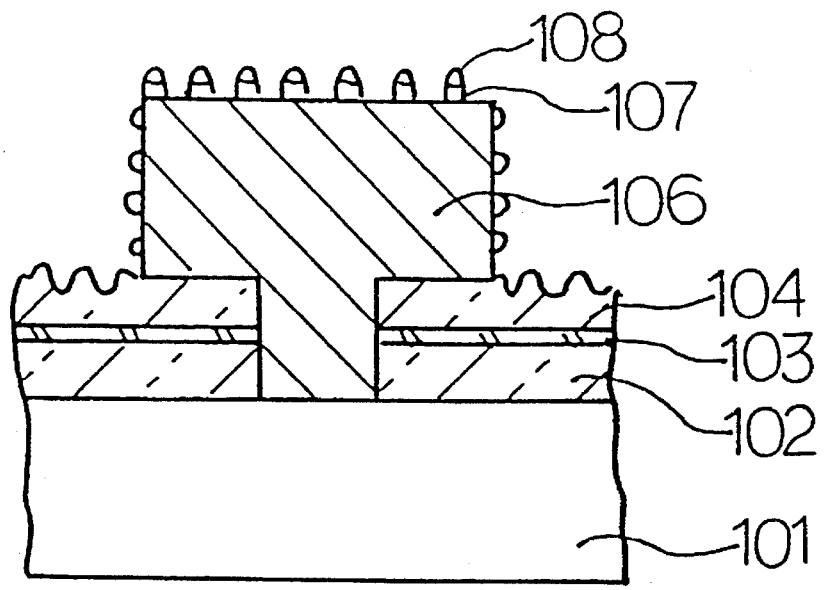
Figure 1C:
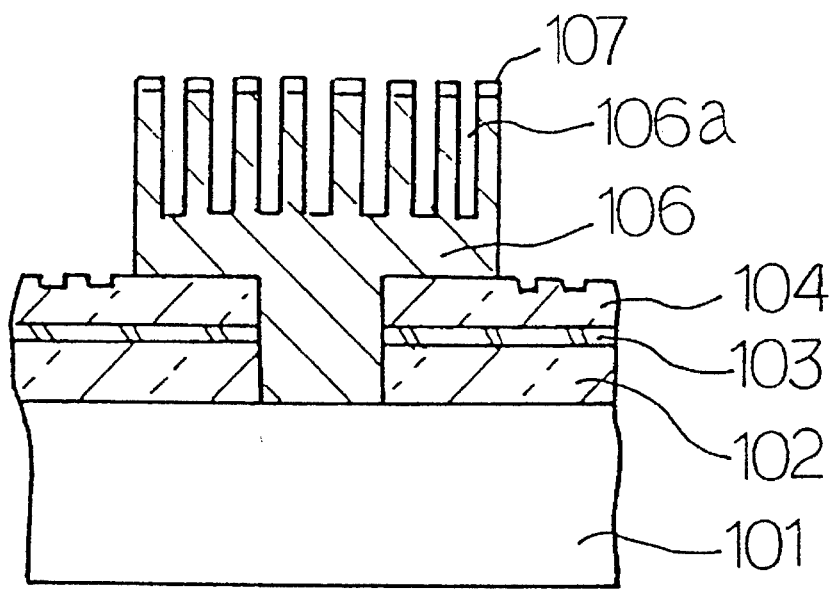
Figure 1D:
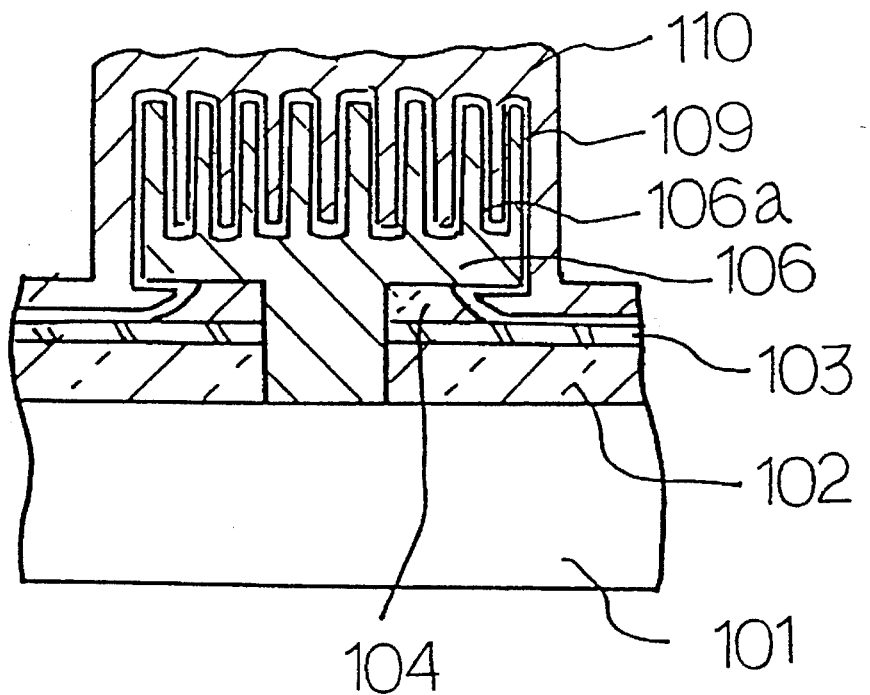
Figure 2:
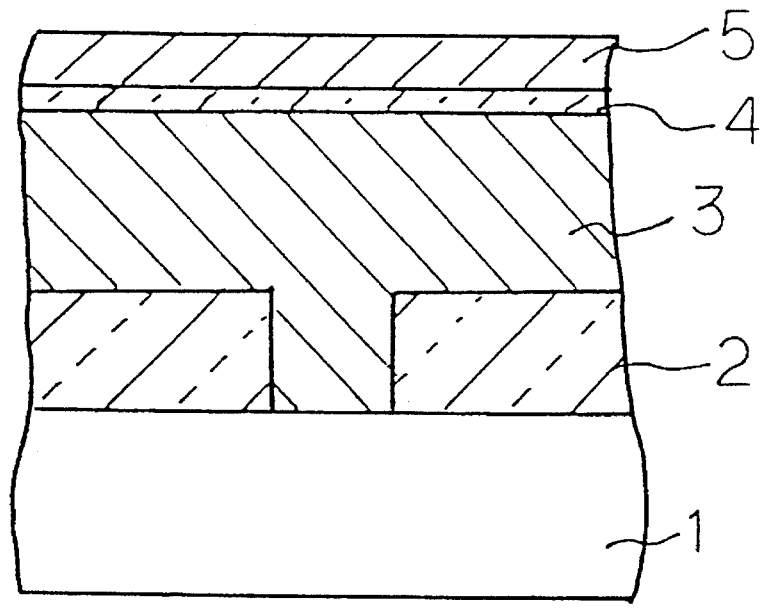
FIGS. 2A to 2D are cross sectional elevation views illustrative of a micro-trench storage capacitor in sequential fabrication steps involved in a novel fabrication method of a first embodiment according to the present invention.
Figure 2:
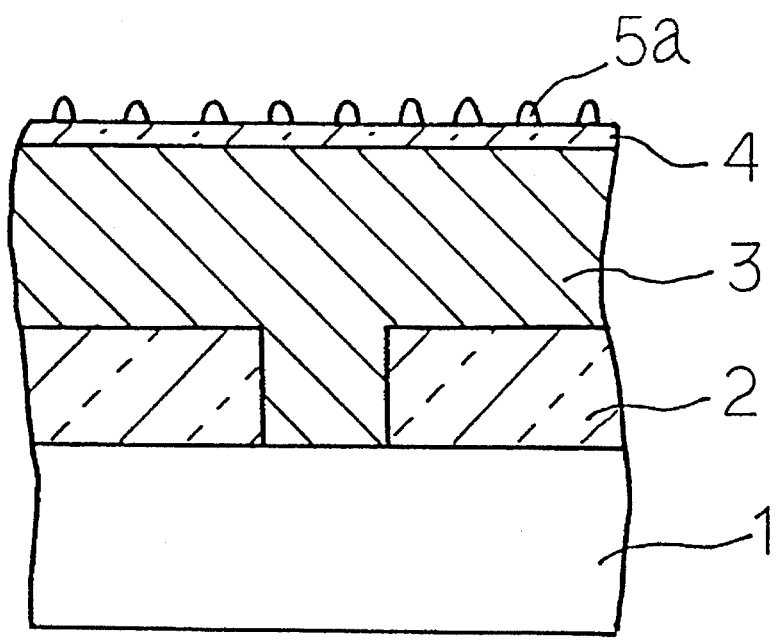
Figure 2:
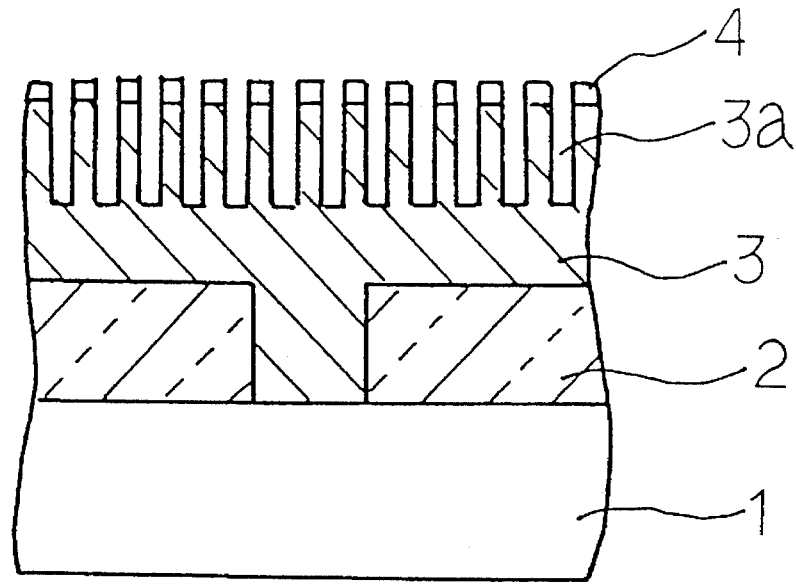
Figure 2:
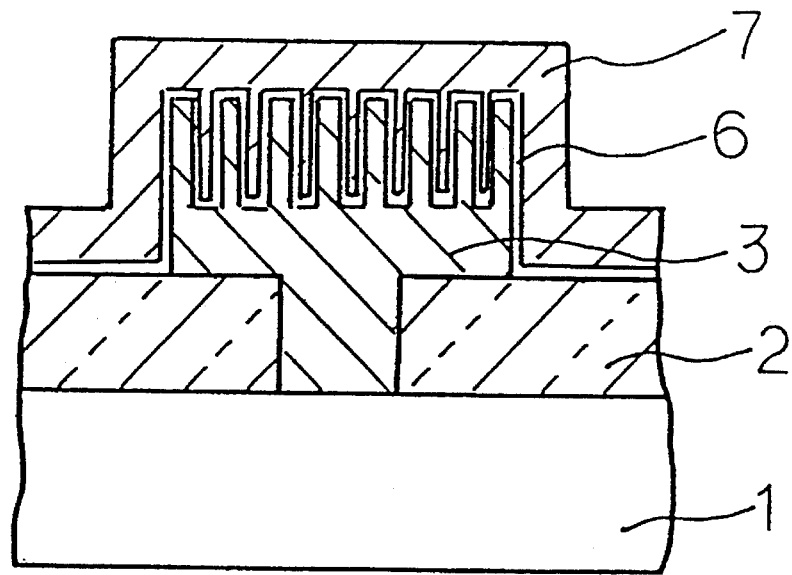

With reference to FIG. 2A, an isolation silicon oxide film 2 is formed on a silicon substrate 1. A contact hole is formed in the isolation film 2 by use of lithography and etching processes. A first polysilicon film 3 having a thickness of 400 nanometers is deposited on a top surface of the isolation silicon oxide film 2 and also within the contact hole so that the polysilicon is in contact with a part of the surface of the silicon substrate 1. A thermal diffusion using a $POCl_3$ source gas is carried out to introduce phosphorus into the first polysilicon film 3 to reduce the resistivity thereof. A chemical vapor deposition is carried out to deposit a silicon oxide film 4 having a thickness of 20 nanometers on the first polysilicon film 3. A chemical vapor deposition is carried out to deposit a second polysilicon film 5 on a surface of the silicon oxide film 4 in which the second polysilicon film has a thickness in the range of from 50 to 100 nanometers. A thermal diffusion is carried out by use of a $POCl_3$ source gas to introduce phosphorus into the second polysilicon film 5 therein an impurity concentration of phosphorus may be in the range of from $1\times10^{20}$ to $5\times10^{20}$ atm/cm$^3$.

Figure 3:
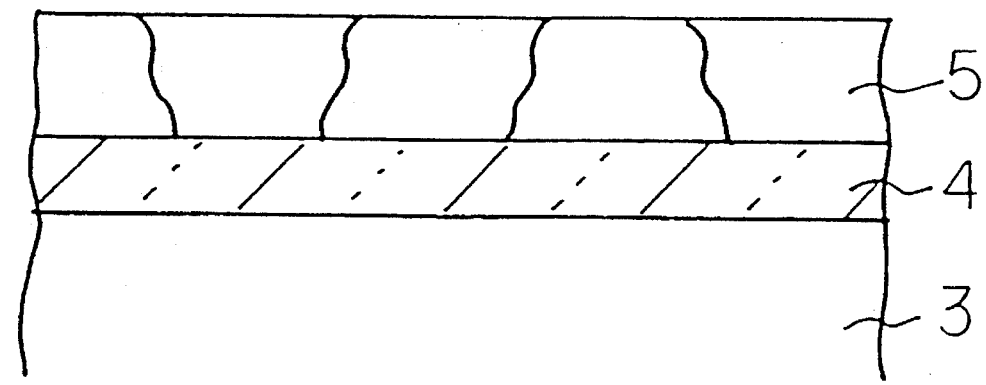
FIGS. 3A and 3B are fragmentary cross sectional elevation views illustrative of segregation of impurity in a polysilicon film and silicon crystal grains in a fabrication process involved in a novel fabrication method for a micro-trench storage capacitor according to the present invention.
Figure 3:
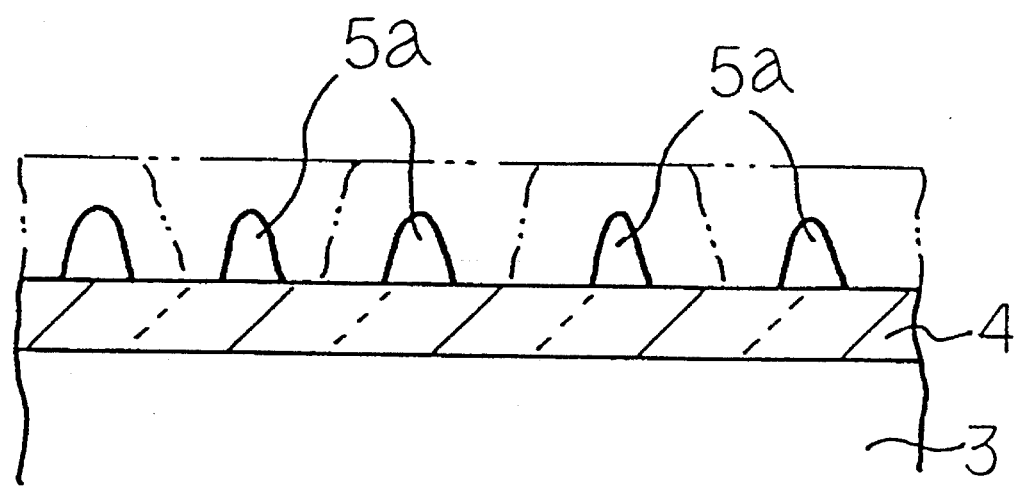

With reference to FIG. 2B, the second polysilicon film 5 with the phosphorus high impurity concentration is exposed to an etchant including phosphoric acid for 60 to 150 minutes, preferably 120 minutes, where the etchant comprises a liquid including phosphoric acid at 85% of impurity concentration, a temperature in the range of from 150° to 170° C. so as to cause a segregation of the highly doped phosphorus thereby crystal grains of monocrystal silicon 5a are formed as illustrated in FIG. 3A. Instead of the above etchant, a vaporized phosphoric acid can also be used. The etching rate is quite different between the silicon crystal grain and its peripheral region into which phosphorous is doped at a higher concentration than a doping concentration of the crystal grain. The etching rate depends on a doping concentration. The peripheral region having a high doping concentration of phosphorus has a higher etching rate than an etching rate of the crystal grain. Such difference in the chemical etching rate between the crystal silicon grains and its peripheral region permit a selective etching of the second polysilicon film to leave only crystal grains 5a as illustrated in FIG. 3B.

With reference back to FIG. 2C, an anisotropic dry etching is carried out by use of the remaining crystal grains 5a as a mask for a selective removal of the silicon oxide film 4 so as to leave the silicon oxide film 4 but only under the crystal grain mask 5a. The remaining silicon oxide film 4 may serve as a mask having an extremely fine pattern. An anisotropic dry etching is carried out by use of the silicon oxide film mask 4 for a selective removal of the first polysilicon film 3 to form micro trench grooves 3a under apertures of the silicon oxide mask 4 and trench pillars defined by the micro trench grooves 3a. The use of the fine mask prepared by the crystal grain mask may provide a micro trench structure.

Widths of the trench pillar and the trench groove are defined by a size of the crystal grain and intervals thereof respectively. Accordingly, the widths of the trench pillar and the trench groove may be controllable by controlling the crystal grain size and the interval thereof. The crystal grain size and the intervals thereof may be controllable by varying the conditions of the diffusion processes in introduction of phosphorus into the second polysilicon film 5. As to the conditions of the diffusion process, a high diffusion temperature and a long diffusion time may provide large size crystal grains. Actually, the crystal grain size may be variable in the range of from approximately 10 nanometers and 100 nanometers. The width of the trench pillar and the interval of the trench groove may be variable in the range of from 10 nanometers and 100 nanometers.

A depth of the trench grooves or a height of the trench pillars may be controllable by controlling a time of the anisotropic etching process. In this embodiment, the depth of the trench grooves or the height of the trench pillars is 300 nanometers.

With reference to FIG. 2D, the silicon oxide mask 4 is removed by etching using hydrofluoric acid. The first polysilicon film with the micro trench structure is defined by use of lithography and etching techniques to form a bottom electrode. A thin dielectric film 6 is formed on an entire surface of the micro trench groove structure so that an entire surface of the micro trench grooves is covered by a thin dielectric film. A thickness of the dielectric film 6 has to be sufficiently thin as compared to the width of the trench groove. A third polysilicon film 7 into which phosphorus is introduced is formed on an entire surface of the dielectric film 6 so that the micro trench grooves are exactly filled with the third polysilicon film 7. The third polysilicon film 7 is defined by use of lithography and etching processes to form a top electrode. This results in a completion of the fabrication steps for the stacked capacitor according to the present invention.

The above stacked capacitor with the micro trench groove structure prepared by the novel fabrication processes of the first embodiment according to the present invention has a greatly enlarged interface area of the dielectric film to the bottom or top electrode so that the stacked capacitor may have a greatly increased capacity of approximately 5 times or more as large as a capacity of the normal stacked capacitor without such trench groove structure.

A second embodiment will be described in detail with reference to FIGS. 4A to 4D in which a micro-trench storage capacitor is fabricated by a novel fabrication method.

Figure 4:
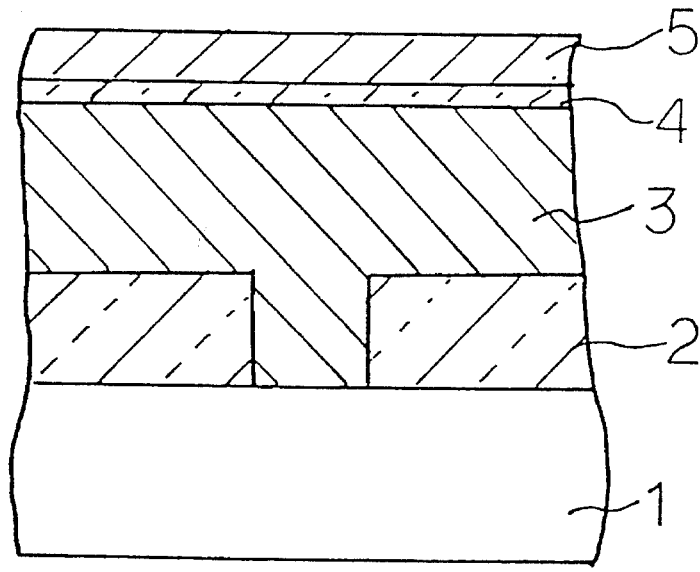
FIGS. 4A to 4D are cross sectional elevation views illustrative of a micro-trench storage capacitor in sequential fabrication steps involved in a novel fabrication method of a second embodiment according to the present invention.
Figure 4:
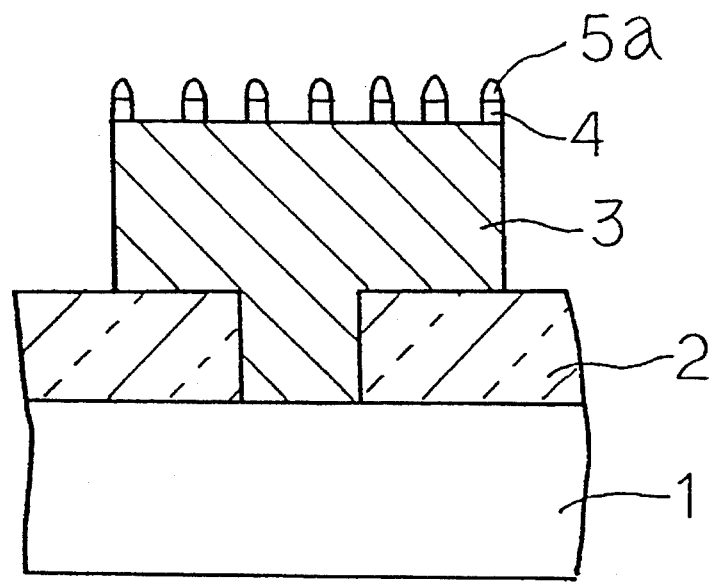

With reference to FIG. 4A, an isolation silicon oxide film 2 is formed on a silicon substrate 1. A contact hole is formed in the isolation film 2 by use of lithography and etching processes. A first polysilicon film 3 having a thickness of 400 nanometers is deposited on a top surface of the isolation silicon oxide film 2 and also within the contact hole so that the polysilicon is in contact with a part of the surface of the silicon substrate 1. A thermal diffusion using a $POCl_3$ source gas is carried out to introduce phosphorus into the first polysilicon film 3 for reduction of the resistivity thereof. A chemical vapor deposition is carried out to deposit a silicon oxide film 4 having a thickness of 20 nanometers on the first polysilicon film 3. A chemical vapor deposition is carried out to deposit a second polysilicon film 5 on a surface of the silicon oxide film 4 in which the second polysilicon film has a thickness in the range of from 50 to 100 nanometers. A thermal diffusion is carried out by use of a $POCl_3$ source gas to introduce phosphorus into the second polysilicon film 5 therein an impurity concentration of phosphorus may be in the range of from $1\times10^{20}$ to $5\times10^{20}$ atm/cm$^3$.

With reference to FIG. 4B, the second polysilicon film 5 with the phosphorus high impurity concentration is exposed to an etchant including phosphoric acid for 60 to 150 minutes, preferably 120 minutes, where the etchant comprises a liquid including phosphoric acid at 85% of impurity concentration, a temperature in the range of from 150° to 170° C. so as to cause a segregation of the highly doped phosphorus thereby crystal grains of monocrystal silicon are formed. In place of the above etchant, a vaporized phosphoric acid may also be used. The etching rate is quite different between the silicon crystal grain and its peripheral region into which phosphorous is doped at a higher concentration than a doping concentration of the crystal grain. The etching rate depends on a doping concentration. The peripheral region having a high doping concentration of phosphorus has a higher etching rate than an etching rate of the crystal grain. Such the difference in the chemical etching rate between the crystal silicon grains and its peripheral region may permit a selective etching of the second polysilicon film to leave only crystal grains 5a. An anisotropic dry etching is carried out by use of the remaining crystal grains 5a as a mask for a selective removal of the silicon oxide film 4 so as to leave the silicon oxide film 4 but only under the crystal grain mask 5a. The first polysilicon film 3 covered by the silicon oxide film mask 4 is subsequently defined by use of lithography and etching techniques to form a bottom electrode.

Figure 4C:
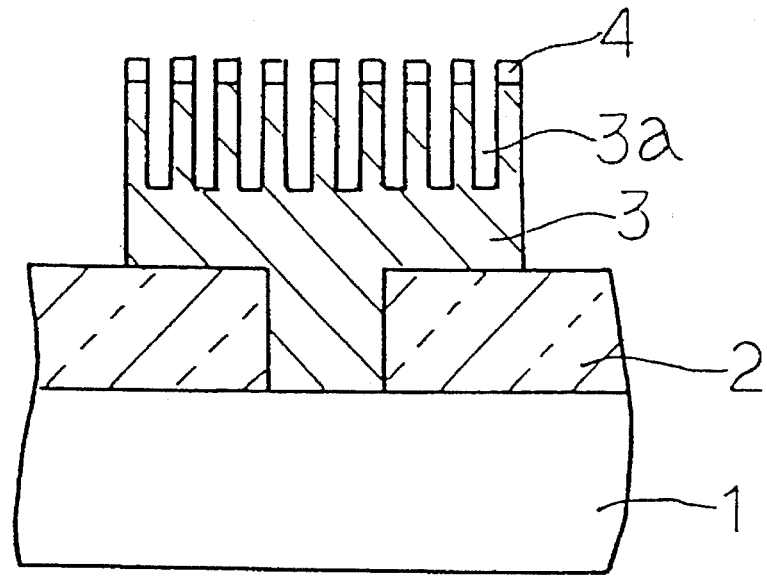

With reference to FIG. 4C, the remaining silicon oxide film overlaying the bottom electrode may serve as a mask having an extremely fine pattern. An anisotropic dry etching is carried out by use of the silicon oxide film mask 4 for a selective removal of the first polysilicon film 3 to form micro trench grooves 3a under apertures of the silicon oxide mask 4 and trench pillars defined by the micro trench grooves 3a. The use of the fine mask prepared by the crystal grain mask may provide a micro trench structure.

Widths of the trench pillar and the trench groove are defined by a size of the crystal grain and intervals thereof respectively. Accordingly, the widths of the trench pillar and the trench groove may be controllable by controlling the crystal grain size and the interval thereof. The crystal grain size and the interval thereof may be controllable by varying the conditions of the diffusion processes in introduction of phosphorus into the second polysilicon film 5. As to the conditions of the diffusion process, a high diffusion temperature and a long diffusion time may provide large size crystal grains. Actually, the crystal grain size may be variable in the range of from approximately 10 nanometers and 100 nanometers. The width of the trench pillar and the interval of the trench groove may be variable in the range of from 10 nanometers and 100 nanometers.

A depth of the trench grooves or a height of the trench pillars may be controllable by controlling a time of the anisotropic etching process. In this embodiment, the depth of the trench grooves or the height of the trench pillars is 300 nanometers.

Figure 4D:
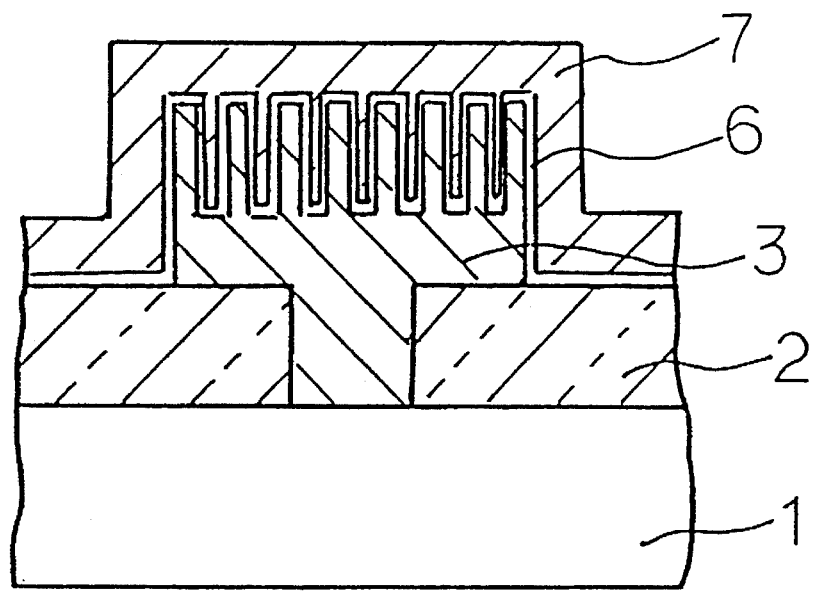

With reference to FIG. 4D, the silicon oxide mask 4 is removed by etching using hydrofluoric acid. A thin dielectric film 6 is formed on an entire surface of the micro trench groove structure so that an entire surface of the micro trench grooves is covered by a thin dielectric film. A thickness of the dielectric film 6 has to be sufficiently thin as compared to the width of the trench groove. A third polysilicon film 7 into which phosphorus is introduced is formed on an entire surface of the dielectric film 6 so that the micro trench grooves are exactly filled with the third polysilicon film 7. The third polysilicon film 7 is defined by use of lithography and etching processes to form a top electrode. This results in a completion of the fabrication steps for the stacked capacitor.

The above stacked capacitor with the micro trench groove structure prepared by the novel fabrication processes of the second embodiment according to the present invention has a greatly enlarged interface area of the dielectric film to the bottom or top electrode so that the stacked capacitor may have a greatly increased capacity of approximately 5 times or more as large as a capacity of the normal stacked capacitor without such trench groove structure.

A third embodiment will be described in detail with reference to FIGS. 5A to 5D in which a micro-trench storage capacitor is fabricated by a novel fabrication method.

Figure 5:
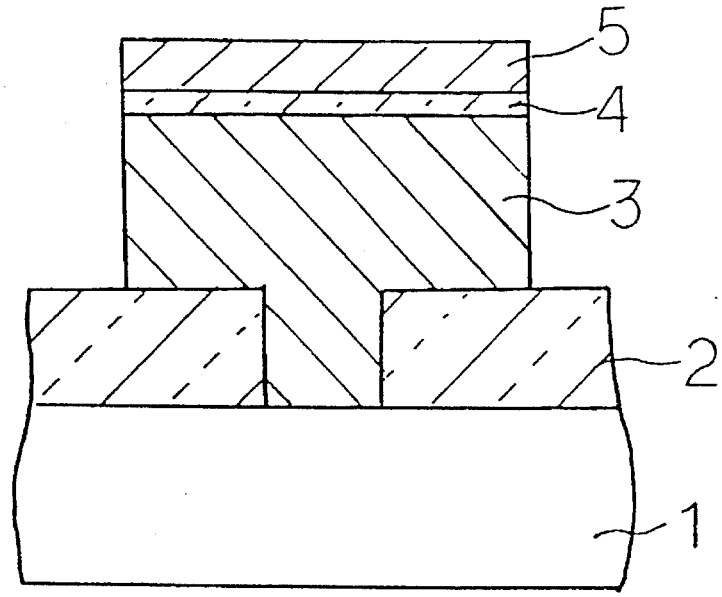
FIGS. 5A to 5D are cross sectional elevation views illustrative of a micro-trench storage capacitor in sequential fabrication steps involved in a novel fabrication method of a third embodiment according to the present invention.
Figure 5:
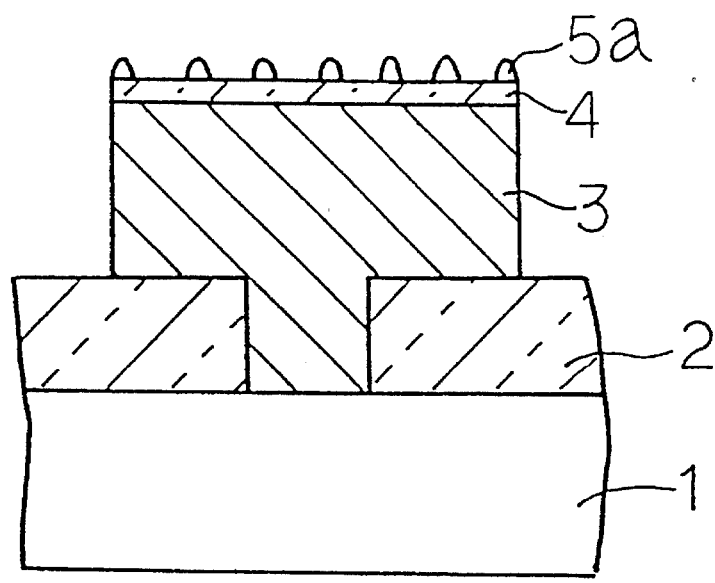
Figure 5:
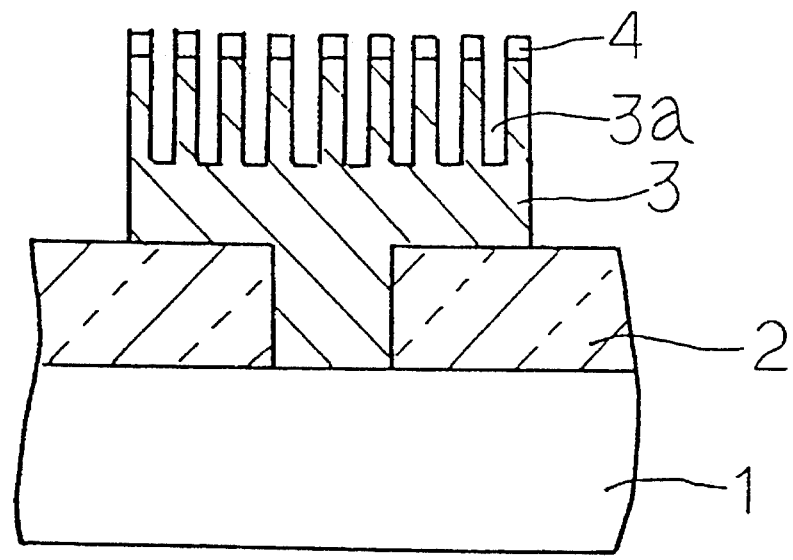
Figure 5:
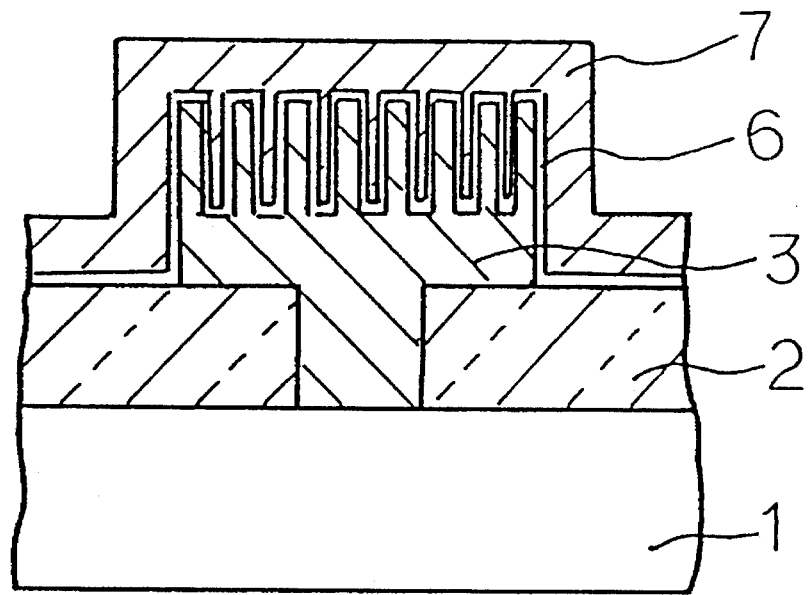

With reference to FIG. 5A, an isolation silicon oxide film 2 is formed on a silicon substrate 1. A contact hole is formed in the isolation film 2 by use of lithography and etching processes. A first polysilicon film 3 having a thickness of 400 nanometers is deposited on a top surface of the isolation silicon oxide film 2 and also within the contact hole so that the polysilicon is in contact with a part of the surface of the silicon substrate 1. A thermal diffusion using a $POCl_3$ source gas is carried out to introduce phosphorus into the first polysilicon film 3 for reduction of the resistivity thereof. The deposited first polysilicon film is defined by use of lithography and etching techniques to form a bottom electrode. A chemical vapor deposition is carried out to deposit a silicon oxide film 4 having a thickness of 20 nanometers on the first polysilicon film 3 as the bottom electrode. A chemical vapor deposition is carried out to deposit a second polysilicon film 5 on a surface of the silicon oxide film 4 in which the second polysilicon film 5 has a thickness in the range of from 50 to 100 nanometers. A thermal diffusion is carried out by use of a $POCl_3$ source gas to introduce phosphorus into the second polysilicon film 5 therein an impurity concentration of phosphorus may be in the range of from $1\times10^{20}$ to $5\times10^{20}$ atm/cm$^3$.

With reference to FIG. 5B, the second polysilicon film 5 with the phosphorus high impurity concentration is exposed to an etchant including phosphoric acid for 60 to 150 minutes, preferably 120 minutes, where the etchant comprises a liquid including phosphoric acid at 85% of impurity concentration, a temperature in the range of from 150° to 170° C. as to cause a segregation of the highly doped phosphorus thereby crystal grains of monocrystal silicon are formed. In place of the above etchant, a vaporized phosphoric acid may also be used. The etching rate is quite different between the silicon crystal grain and its peripheral region into which phosphorous is doped at a higher concentration than a doping concentration of the crystal grain. The etching rate depends on a doping concentration. The peripheral region having a high doping concentration of phosphorus has a higher etching rate than an etching rate of the crystal grain. Such the difference in the chemical etching rate between the crystal silicon grains and its peripheral region may permit a selective etching of the second polysilicon film to leave only crystal grains 5a.

With reference back to FIG. 5C, an anisotropic dry etching is carried out by use of the remaining crystal grains 5a as a mask for a selective removal of the silicon oxide film 4 so as to leave the silicon oxide film 4 but only under the crystal grain mask 5a. The remaining silicon oxide film 4 may serve as a mask having an extremely fine pattern. An anisotropic dry etching is carried out by use of the silicon oxide film mask 4 for a selective removal of the first polysilicon film 3 to form micro trench grooves 3a under apertures of the silicon oxide mask 4 and trench pillars defined by the micro trench grooves 3a. The use of the fine mask prepared by the crystal grain mask may provide a micro trench structure.

Widths of the trench pillar and the trench groove are defined by a size of the crystal grain and intervals thereof respectively. Accordingly, the widths of the trench pillar and the trench groove may be controllable by controlling the crystal grain size and the interval thereof. The crystal grain size and the intervals thereof may be controllable by varying the conditions of the diffusion processes in introduction of phosphorus into the second polysilicon film 5. As to the conditions of the diffusion process, a high diffusion temperature and a long diffusion time may provide large size crystal grains. Actually, the crystal grain size may be variable in the range of from approximately 10 nanometers and 100 nanometers. The width of the trench pillar and the interval of the trench groove may be variable in the range of from 10 nanometers and 100 nanometers.

A depth of the trench grooves or a height of the trench pillars may be controllable by controlling a time of the anisotropic etching process. In this embodiment, the depth of the trench grooves or the height of the trench pillars is 300 nanometers.

With reference to FIG. 5D, the silicon oxide mask 4 is removed by etching using hydrofluoric acid. A thin dielectric film 6 is formed on an entire surface of the micro trench groove structure so that an entire surface of the micro trench grooves is covered by a thin dielectric film. A thickness of the dielectric film 6 has to be sufficiently thin as compared to the width of the trench groove. A third polysilicon film 7 into which phosphorus is introduced is formed on an entire surface of the dielectric film 6 so that the micro trench grooves are exactly filled with the third polysilicon film 7. The third polysilicon film 7 is defined by use of lithography and etching processes to form a top electrode. This results in a completion of the fabrication steps for the stacked capacitor.

The above stacked capacitor with the micro trench groove structure prepared by the novel fabrication processes of the third embodiment according to the present invention has a greatly enlarged interface area of the dielectric film to the bottom or top electrode so that the stacked capacitor may have a greatly increased capacity of approximately 5 times or more as large as a capacity of the normal stacked capacitor without such trench groove structure.

A fourth embodiment will be described in detail with reference to FIGS. 6A to 6D in which a micro-trench storage capacitor is fabricated by a novel fabrication method.

Figure 6A:
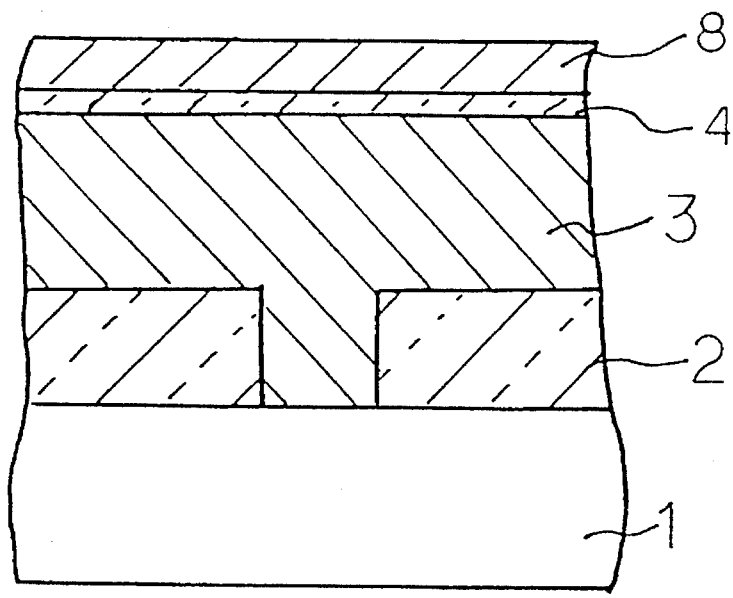
FIGS. 6A to 6D are cross sectional elevation views illustrative of a micro-trench storage capacitor in sequential fabrication steps involved in a novel fabrication method of a fourth embodiment according to the present invention.

With reference to FIG. 6A, an isolation silicon oxide film 2 is formed on a silicon substrate 1. A contact hole is formed in the isolation film 2 by use of lithography and etching processes. A first polysilicon film 3 having a thickness of 400 nanometers is deposited on a top surface of the isolation silicon oxide film 2 and also within the contact hole so that the polysilicon is in contact with a part of the surface of the silicon substrate 1. A thermal diffusion using a $POCl_3$ source gas is carried out to introduce phosphorus into the first polysilicon film 3 for reduction of the resistivity thereof. A chemical vapor deposition is carried out to deposit a silicon oxide film 4 having a thickness of 20 nanometers on the first polysilicon film 3. A chemical vapor deposition is carried out by use of gases including $SiH_4$ and $PH_3$ at a temperature of 580° C. to deposit an amorphous silicon film 8 having a thickness in the range of from 30 to 60 nanometers on a surface of the silicon oxide film 4 in which the second polysilicon film includes an impurity of phosphorus at a concentration in the range of from $6\times 10^{20}$ to $7\times 10^{20}$ $atm/cm^3$.

Figure 6B:
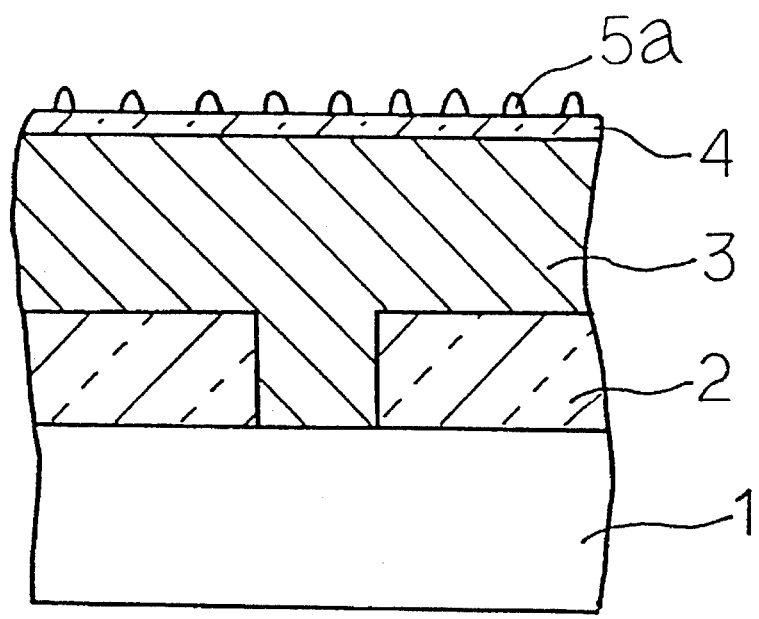

With reference to FIG. 6B, the amorphous silicon film 8 with the phosphorus high impurity concentration is subjected to an annealing at a temperature of 800° C. for 15 to 30 minutes in a nitrogen atmosphere to cause a crystalization of the amorphous silicon film 8 into a polysilicon film 5 including crystal grains. The crystal grain size involved in the polysilicon film 5 is defined by a thickness of the polysilicon film 5 crystallized from the amorphous silicon film 8. Then, the crystal grain size involved in the polycrystalline silicon film 5 is defined by the thickness of the amorphous silicon film 8. The thickness of the amorphous silicon film is readily controllable. According to this method, it is very easy to control the crystal grain size in the polysilicon film 5. According to this method, it is unnecessary to form hemispherical grains. This may permit the fabrication processes to be free from any use of an extremely low oxygen atmosphere in a special annealing process needed for forming the hemispherical grains. This results in a facilitation of the formation of the crystal grains.

The polysilicon film including the crystal grains is then exposed to an etchant including phosphoric acid for 60 to 150 minutes, preferably 120 minutes, where the etchant comprises a liquid including phosphoric acid at 85% of impurity concentration, a temperature in the range of from 150° to 170° C. so as to cause a segregation of the highly doped phosphorus thereby crystal grains of monocrystal silicon are formed. In place of the above etchant, a vaporized phosphoric acid may also be used. The etching rate is quite different between the silicon crystal grain and its peripheral region into which phosphorous is doped at a higher concentration than a doping concentration of the crystal grain. The etching rate depends on a doping concentration. The peripheral region having a high doping concentration of phosphorus has a higher etching rate than an etching rate of the crystal grain. Such the difference in the chemical etching rate between the crystal silicon grains and its peripheral region may permit a selective etching of the second polysilicon film to leave only the crystal grains 5a.

Figure 6C:
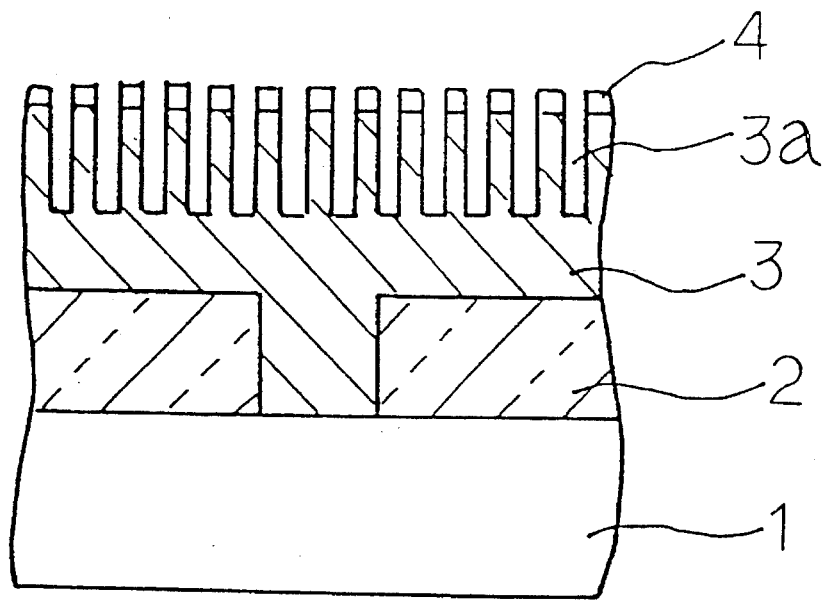

With reference to FIG. 6C, an anisotropic dry etching is carried out by use of the remaining crystal grains 5a as a mask for a selective removal of the silicon oxide film 4 so as to leave the silicon oxide film 4 but only under the crystal grain mask 5a. The remaining silicon oxide film 4 may serve as a mask having an extremely fine pattern. An anisotropic dry etching is carried out by use of the silicon oxide film mask 4 for a selective removal of the first polysilicon film 3 to form micro trench grooves 3a under apertures of the silicon oxide mask 4 and trench pillars defined by the micro trench grooves 3a. The use of the fine mask prepared by the crystal grain mask provides a micro trench structure.

Widths of the trench pillar and the trench groove are defined by a size of the crystal grain and intervals thereof respectively. Accordingly, the widths of the trench pillar and the trench groove may be controllable by controlling the crystal grain size and the interval thereof. The crystal grain size and the intervals thereof may be controllable by varying the conditions of the diffusion processes in introduction of phosphorus into the second polysilicon film 5. As to the conditions of the diffusion process, a high diffusion temperature and a long diffusion time may provide large size crystal grains. Actually, the crystal grain size may be variable in the range of from approximately 10 nanometers and 100 nanometers. The width of the trench pillar and the interval of the trench groove may be variable in the range of from 10 nanometers and 100 nanometers.

A depth of the trench grooves or a height of the trench pillars may be controllable by controlling a time of the anisotropic etching process. In this embodiment, the depth of the trench grooves or the height of the trench pillars is 300 nanometers.

Figure 6D:
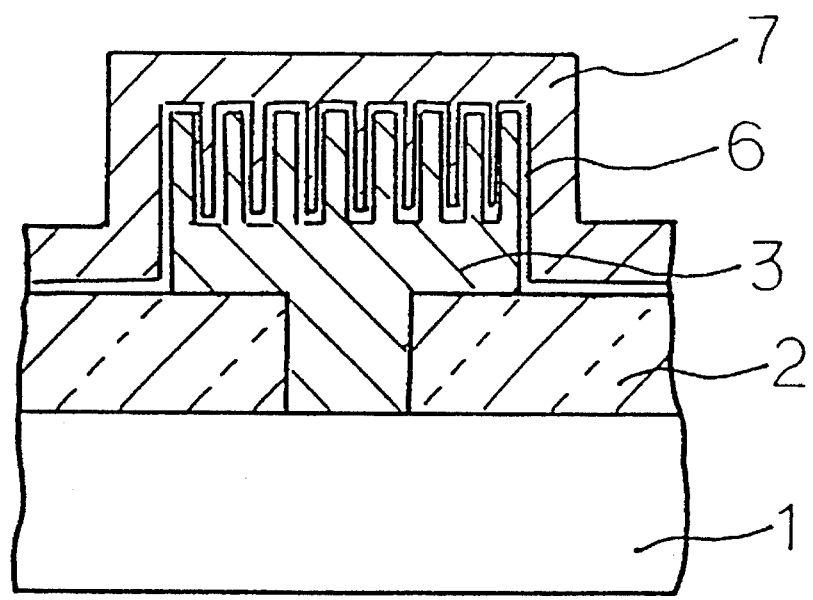

With reference to FIG. 6D, the silicon oxide mask 4 is removed by etching using hydrofluoric acid. The first polysilicon film with the micro trench structure is defined by use of lithography and etching techniques to form a bottom electrode. A thin dielectric film 6 is formed on an entire surface of the micro trench groove structure so that an entire surface of the micro trench grooves is covered by a thin dielectric film. A thickness of the dielectric film 6 has to be sufficiently thin as compared to the width of the trench groove. A third polysilicon film 7 into which phosphorus is introduced is formed on an entire surface of the dielectric film 6 so that the micro trench grooves are exactly filled with the third polysilicon film 7. The third polysilicon film 7 is defined by use of lithography and etching processes to form a top electrode. This results in a completion of the fabrication steps for the stacked capacitor.

The above stacked capacitor with the micro trench groove structure prepared by the novel fabrication processes of the fourth embodiment according to the present invention has a greatly enlarged interface area of the dielectric film to the bottom or top electrode so that the stacked capacitor may have a greatly increased capacity of approximately 5 times or more as large as a capacity of the normal stacked capacitor without such trench groove structure.

A fifth embodiment will be described in detail with reference to FIGS. 7A to 7C in which a micro-trench storage capacitor for dynamic random access memory device is fabricated by a novel fabrication method as described below.

Figure 7A:
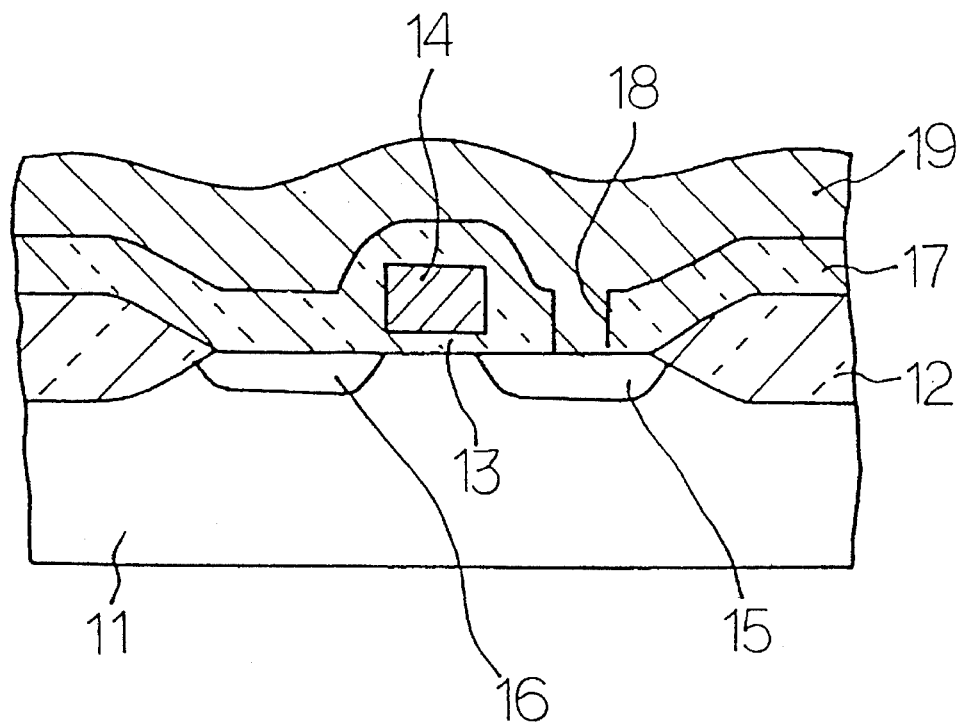
FIGS. 7A to 7C are cross sectional elevation views illustrative of a micro-trench storage capacitor formed within a dynamic random access memory device in sequential fabrication steps involved in a novel fabrication method of a fourth embodiment according to the present invention.

With reference to FIG. 7A, a field silicon oxide film 12 is selectively formed on a silicon substrate 11 by the normal processes so that the field oxide film 12 may serve as an isolation oxide film for defining an area on which elements will be formed. A gate oxide film 13 is formed in the element formation area defined by the field oxide film 12. A gate electrode 14 made of polysilicon is formed on the gate oxide film 13. An ion-implantation of an impurity into the silicon substrate 11 is carried out by use of the gate electrode 14 and the field oxide film 12 as masks so that source and drain regions 15 and 16 are formed in the exposed surface region of the silicon substrate 11 by the self-alignment technique. A contact hole is formed in the isolation film 2 by use of lithography and etching processes. A first inter-layer insulator 17 made of silicon oxide is formed by a chemical vapor deposition on an entire surface of the device so as to cover the field oxide film 12, the gate electrode 14 and the source and drain regions 15 and 16. A contact hole 18 is formed in the first inter-layer insulator 17 over the source region 15 so that a part of the source region 15 is exposed through the contact hole 18. A first polysilicon film 19 having a thickness of 400 nanometers is deposited by a chemical vapor deposition on the first inter-layer insulator 17 and within the contact hole 18.

Figure 7B:
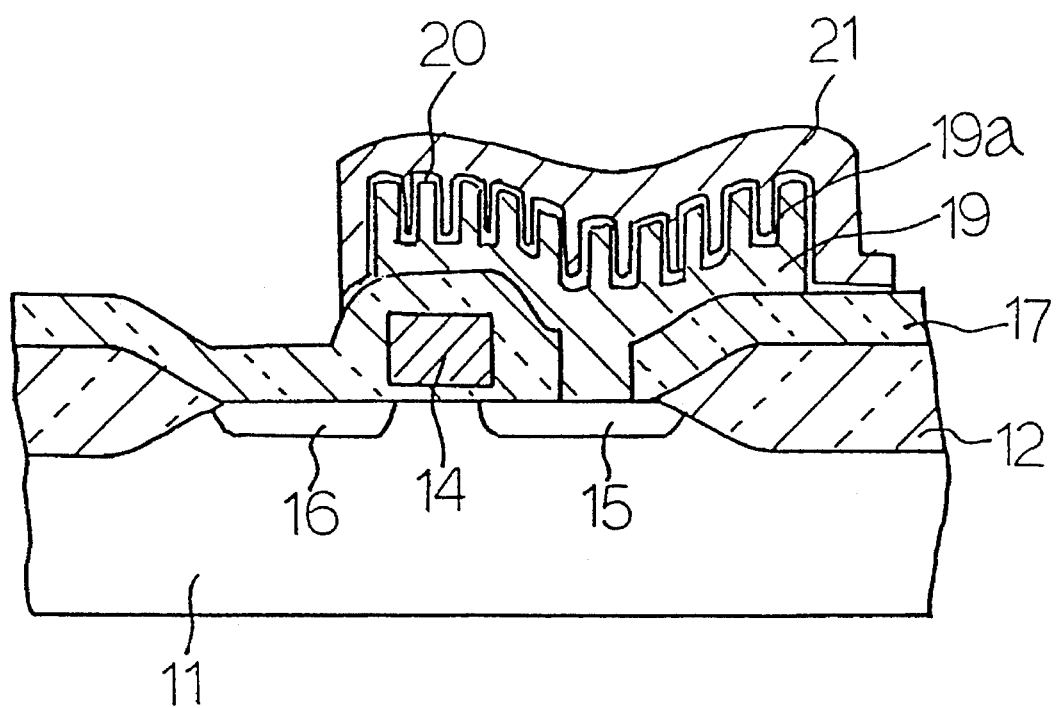

With reference to FIG. 7B, a thermal diffusion using a $POCl_3$ source gas is carried out to introduce phosphorus into the first polysilicon film 19 for reduction of the resistivity thereof. The first polysilicon film 19 is defined by lithography and etching processes to form a bottom electrode. A chemical vapor deposition is carried out to deposit a silicon oxide film not illustrated and having a thickness of 20 nanometers on the defined first polysilicon film 19. A chemical vapor deposition is carried out to deposit a second polysilicon film not illustrated on a surface of the silicon oxide film in which the second polysilicon film has a thickness in the range of from 50 to 100 nanometers. A thermal diffusion is carried out by use of a $POCl_3$ source gas to introduce phosphorus into the second polysilicon film therein an impurity concentration of phosphorus may be in the range of from $1\times10^{20}$ to $5\times10^{20}$ atm/cm$^3$. The second polysilicon film with the phosphorus high impurity concentration is exposed to an etchant including phosphoric acid for 60 to 150 minutes, preferably 120 minutes, where the etchant comprises a liquid including phosphoric acid at 85% of impurity concentration, a temperature in the range of from 150° to 170° C. so as to cause a segregation of the highly doped phosphorus thereby crystal grains of monocrystal silicon are formed. In place of the above etchant, a vaporized phosphoric acid may also be used. The etching rate is quite different between the silicon crystal grain and its peripheral region into which phosphorous is doped at a higher concentration than a doping concentration of the crystal grain. The etching rate depends on a doping concentration. The peripheral region having a high doping concentration of phosphorus has a higher etching rate than an etching rate of the crystal grain. Such difference in the etching rate permits a selective etching to leave only crystal grains.

Subsequently, an anisotropic dry etching is carried out by use of the remaining crystal grains as a mask for a selective removal of the silicon oxide film so as to leave the silicon oxide film but only under the crystal grain mask. The remaining silicon oxide film may serve as a mask having an extremely fine pattern. An anisotropic dry etching is carried out by use of the silicon oxide film mask for a selective removal of the first polysilicon film 19 to form micro trench grooves 19a under apertures of the silicon oxide mask and trench pillars defined by the micro trench grooves 19a. The silicon oxide mask is removed by etching using hydrofluoric acid. A thin dielectric film 20 is formed on an entire surface of the micro trench groove structure so that an entire surface of the micro trench grooves is covered by the thin dielectric film 20. A thickness of the dielectric film 20 has to be sufficiently thin as compared to the width of the trench groove. A third polysilicon film 21 into which phosphorus is introduced is formed on an entire surface of the dielectric film 20 so that the micro trench grooves are exactly filled with the third polysilicon film 21. The third polysilicon film 21 is defined by use of lithography and etching processes to form a top electrode.

Figure 7C:
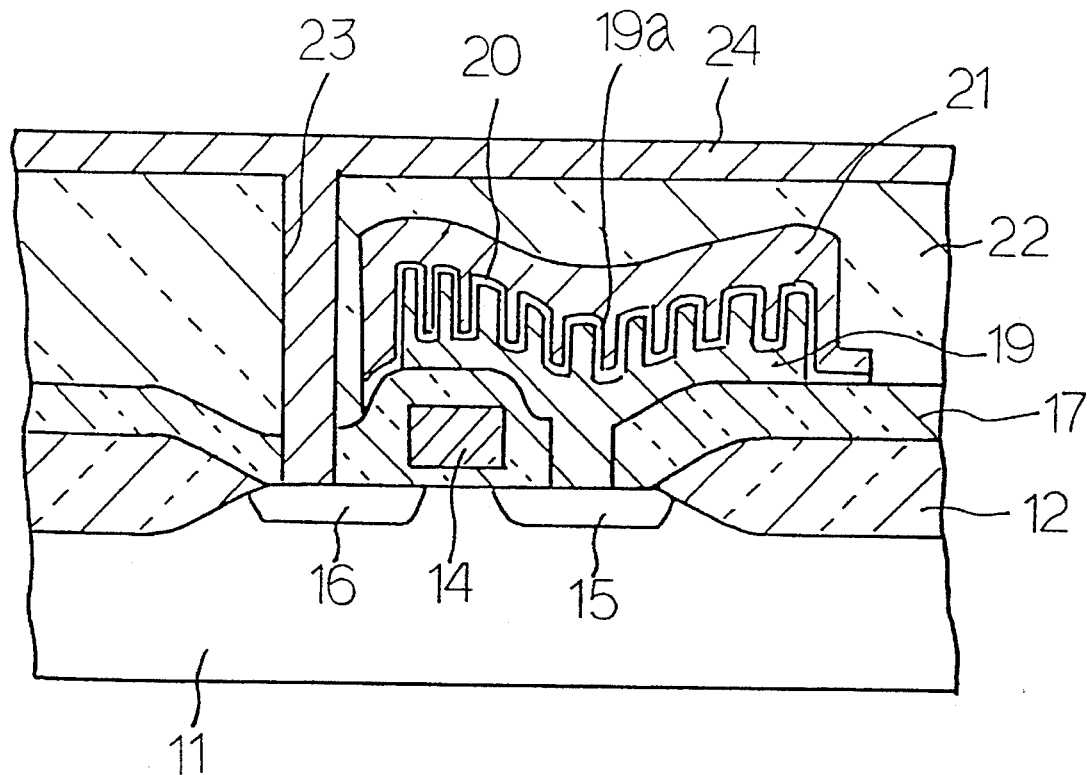

With reference to FIG. 7C, a second inter-layer insulator 22 made of silicon oxide is deposited by a chemical vapor deposition on an entire surface of the device to cover the stacked capacitor prepared by the fabrication processes as described above. A contact hole 23 is formed in the second inter-layer insulator 22 so that a part of the surface of the drain region 16 is exposed through the contact hole 23. An aluminium film is formed on an entire surface of the device to cover the second inter-layer insulator 22 and fill the contact hole 23 so that the aluminium film is in contact with the drain region 16. The aluminium film is subsequently patterned to form aluminium wirings thereby a memory cell involved in the dynamic random access memory (DRAM) is formed.

The above stacked capacitor with the micro trench groove structure prepared by the novel fabrication processes of the fifth embodiment according to the present invention has a greatly enlarged interface area of the dielectric film to the bottom or top electrode so that the stacked capacitor may have a greatly increased capacity of approximately 5 times or more as large as a capacity of the normal stacked capacitor without such trench groove structure.

Although in the above embodiments phosphorus is introduced into the second polysilicon film or the amorphous silicon film after the film was deposited, the introduction of phosphorus may be carried out during a deposition process of the second polysilicon or amorphous silicon film.

Although in the above embodiments the top and bottom electrodes are made of the phosphorus doped polysilicon, the top and bottom electrodes may of course be made of any metals.

Although the invention has been described in detail above in connection with various preferred embodiments thereof, it will be appreciated by those skilled in the art that these embodiments have been provided solely for purposes of illustration, and are in no way to be considered as limiting the invention. Instead, various modifications and substitutions of equivalent techniques will be readily apparent to those skilled in the art upon reading this specification, and such modifications and substitutions are to be considered as falling within the true scope and spirit of the following claims.

What is claimed is :

1. A method of forming a plurality of trenches in a film having an electrical conductivity comprising the steps of:

forming a film having an electrical conductivity;

depositing a silicon oxide film on said electrically conductive film;

forming a polysilicon film doped with an impurity on said silicon oxide film;

subjecting said polysilicon film to an etchant for causing a segregation of said impurity into crystal grains and subsequent selective removal of said polysilicon film to leave only said crystal grains on said silicon oxide film;

subjecting said silicon oxide film to an anisotropic dry etching by use of said crystal grains as a first mask so as to leave only part of said silicon oxide film covered by said crystal grains; and subjecting said electrically conductive film to an anisotropic dry etching by use of said remaining silicon oxide film as a second mask for a selective removal of said electrically conductive film to form a plurality of trenches in said electrically conductive film.

2. The method as claimed in claim 1, wherein said electrically conductive film comprises a polysilicon film.

3. The method as claimed in claim 2, wherein said polysilicon film is doped with phosphorus by use of a thermal diffusion using a source gas of $POCl_3$.

4. The method as claimed in claim 1, wherein said electrically conductive film comprises a metal film.

5. The method as claimed in claim 1, wherein said polysilicon film is doped with phosphorus by use of a thermal diffusion in which an impurity concentration is in the range of from $1\times10^{20}$ to $4\times10^{20}$ atm/cm$^3$.

6. The method as claimed in claim 1, wherein said etchant comprises a liquid comprising a concentration of 85% phosphoric acid to cause a segregation of said phosphorus into crystal grains for a selective removal of said polysilicon film to leave only said crystal grains on said silicon oxide film.

7. The method as claimed in claim 6, wherein said crystal grains have a diameter in the range of about 10 to about 100 nanometers.

8. The method as claimed in claim 7, wherein said trenches have the same width as said grain size and a depth of 300 nanometers.

9. A method of forming a plurality of trenches in a film having an electrical conductivity comprising the steps of:

forming a film having an electrical conductivity;

depositing a silicon oxide film on said electrically conductive film;

forming an amorphous silicon film doped with an impurity on said silicon oxide film;

subjecting said amorphous silicon film to an annealing for a crystallization of said amorphous silicon film into a polysilicon film;

subjecting said polysilicon film including crystal grains to an etchant for a segregation of said impurity into crystal grains and subsequent selective removal of said polysilicon film to leave only said crystal grains on said silicon oxide film;

subjecting said silicon oxide film to an anisotropic dry etching by use of said crystal grains as a first mask so as to leave only part of said silicon oxide film covered by said crystal grains; and subjecting said electrically conductive film to an anisotropic dry etching by use of said remaining silicon oxide film as a second mask for a selective removal of said electrically conductive film to form a plurality of trenches in said electrically conductive film.

10. The method as claimed in claim 9, wherein said electrically conductive film comprises a polysilicon film.

11. The method as claimed in claim 10, wherein said polysilicon film is doped with phosphorus by use of a thermal diffusion using a source gas of $POCl_3$.

12. The method as claimed in claim 9, wherein said electrically conductive film comprises a metal film.

13. The method as claimed in claim 9, wherein said amorphous silicon film is doped with phosphorus at an impurity concentration in the range of from $1\times10^{20}$ to $5\times10^{20}$ atm/cm$^3$.

14. The method as claimed in claim 13, wherein said annealing is carried out at a temperature of 800° C. in a nitrogen atmosphere for 15 to 30 minutes.

15. The method as claimed in claim 9, wherein said etchant comprises a liquid comprising a concentration of 85% phosphoric acid to cause a segregation of said phosphorus into crystal grains for a selective removal of said polysilicon film to leave only said crystal grains on said silicon oxide film.

16. The method as claimed in claim 15, wherein said crystal grains have a diameter in the range of about 10 to about 100 nanometers.

17. The method as claimed in claim 16, wherein said trenches have the same width as said grain size and a depth of 300 nanometers.

18. A method of forming a stacked capacitor with a plurality of trenches comprising the steps of:

forming a film having an electrical conductivity;

depositing a silicon oxide film on said electrically conductive film;

forming a polysilicon film doped with an impurity on said silicon oxide film;

subjecting said polysilicon film to an etchant for causing a segregation of said impurity into crystal grains and subsequent selective removal of said polysilicon film to leave only said crystal grains on said silicon oxide film;

subjecting said silicon oxide film to an anisotropic dry etching by use of said crystal grains as a first mask so as to leave only part of said silicon oxide film covered by said crystal grains;

subjecting said electrically conductive film to an anisotropic dry etching by use of said remaining silicon oxide film as a second mask for a selective removal of said electrically conductive film to form a bottom electrode with a plurality of trenches;

forming a dielectric film on an entire surface of said bottom electrode; and forming a top electrode on said dielectric film.

19. The method as claimed in claim 18, wherein said electrically conductive film comprises a polysilicon film.

20. The method as claimed in claim 19, wherein said polysilicon film is doped with phosphorus by use of a thermal diffusion using a source gas of $POCl_3$.

21. The method as claimed in claim 18, wherein said electrically conductive film comprises a metal film.

22. The method as claimed in claim 18, wherein said polysilicon film is doped with phosphorus by use of a thermal diffusion in which an impurity concentration is in the range of from $1 \times 10^{20}$ to $5 \times 10^{20}$ atm/cm$^3$.

23. The method as claimed in claim 18, wherein said etchant comprises a liquid comprising a concentration of 85% phosphoric acid to cause a segregation of said phosphorus into crystal grains for a selective removal of said polysilicon film to leave only said crystal grains on said silicon oxide film.

24. The method as claimed in claim 23, wherein said crystal grains have a diameter in the range of about 10 to about 100 nanometers.

25. The method as claimed in claim 24, wherein said trenches have the same width as said grain size and a depth of 300 nanometers.

26. A method of forming a stacked capacitor with a plurality of trenches comprising the steps of:

forming a film having an electrical conductivity;

depositing a silicon oxide film on said electrically conductive film;

forming an amorphous silicon film doped with an impurity on said silicon oxide film;

subjecting said amorphous silicon film to an annealing for a crystallization of said amorphous silicon film into a polysilicon film;

subjecting said polysilicon film including crystal grains to an etchant for a segregation of said impurity into crystal grains and subsequent selective removal of said polysilicon film to leave only said crystal grains on said silicon oxide film;

subjecting, said silicon oxide film to an anisotropic dry etching by use of said crystal grains as a first mask so as to leave only part of said silicon oxide film covered by said crystal grains;

subjecting said electrically conductive film to an anisotropic dry etching by use of said remaining silicon oxide film as a second mask for a selective removal of said electrically conductive film to form a bottom electrode with a plurality of trenches;

forming a dielectric film on an entire surface of said bottom electrode; and forming a top electrode on said dielectric film.

27. The method as claimed in claim 26, wherein said electrically conductive film comprises a polysilicon film.

28. The method as claimed in claim 27, wherein said polysilicon film is doped with phosphorus by use of a thermal diffusion using a source gas of $POCl_3$.

29. The method as claimed in claim 26, wherein said electrically conductive film comprises a metal film.

30. The method as claimed in claim 26, wherein said amorphous silicon film is doped with phosphorus at an impurity concentration of approximately $1 \times 10^{20}$ to $5 \times 10^{20}$ atm/cm$^3$.

31. The method as claimed in claim 30, wherein said annealing is carried out at a temperature of 800° C. in a nitrogen atmosphere for 15 to 30 minutes.

32. The method as claimed in claim 26, wherein said etchant comprises a liquid comprising a concentration of 85% phosphoric acid to cause a segregation of said phosphorus into crystal grains for a selective removal of said polysilicon film to leave only said crystal grains on said silicon oxide film.

33. The method as claimed in claim 32, wherein said crystal grains have a diameter in the range of about 10 to about 100 nanometers.

34. The method as claimed in claim 33, wherein said trenches have the same width as said grain size and a depth of 300 nanometers.

35. A method of fabricating a memory cell device with a transistor and a micro trench storage capacitor comprising the steps of:

selectively forming a field oxide film on a surface of a semiconductor substrate;

selectively forming a gate oxide film on an exposed surface area of said semiconductor substrate;

selectively forming a gate electrode on a part of said gate oxide film;

selectively forming source and drain regions in said semiconductor substrate by use of an ion-implantation of an impurity using said gate electrode as a mask;

forming a first inter-layer insulator on an entire surface of the device;

forming a first contact hole in said first inter-layer insulator over said source region to form a field effect transistor;

forming a film having an electrical conductivity on said first inter-layer insulator and within said first contact hole;

depositing a silicon oxide film on said electrically conductive film;

forming a polysilicon film doped with an impurity on said silicon oxide film;

subjecting said polysilicon film to an etchant for causing a segregation of said impurity into crystal grains and subsequent selective removal of said polysilicon film to leave only said crystal grains on said silicon oxide film;

subjecting said silicon oxide film to an anisotropic dry etching by use of said crystal grains as a first mask so as to leave only part of said silicon oxide film covered by said crystal grains;

subjecting said electrically conductive film to an anisotropic dry etching by use of said remaining silicon oxide film as a second mask for a selective removal of said electrically conductive film to form a bottom electrode with a plurality of trenches;

forming a dielectric film on an entire surface of said bottom electrode; and forming a top electrode on said dielectric film.

36. The method as claimed in claim 35, wherein said electrically conductive film comprises a polysilicon film.

37. The method as claimed in claim 36, wherein said polysilicon film is doped with phosphorus by use of a thermal diffusion using a source gas of $POCl_3$.

38. The method as claimed in claim 35, wherein said electrically conductive film comprises a metal film.

39. The method as claimed in claim 35, wherein said polysilicon film is doped with phosphorus by use of a thermal diffusion in which an impurity concentration is in the range of from $1\times10^{20}$ to $5\times10^{20}$ atm/cm$^3$.

40. The method as claimed in claim 35, wherein said etchant comprises a liquid comprising a concentration of 85% phosphoric acid to cause a segregation of said phosphorus into crystal grains for a selective removal of said polysilicon film to leave only said crystal grains on said silicon oxide film.

41. The method as claimed in claim 40, wherein said crystal grains have a diameter in the range of about 10 to about 100 nanometers.

42. The method as claimed in claim 41, wherein said trench grooves have the same width as said grain size and a depth of 300 nanometers.

* * * * *